(12) United States Patent
Delrosso

(10) Patent No.: US 8,096,463 B2
(45) Date of Patent: Jan. 17, 2012

(54) WIRING METHOD AND DEVICE

(75) Inventor: Giovanni Delrosso, Milan (IT)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 516 days.

(21) Appl. No.: 11/793,290

(22) PCT Filed: Dec. 29, 2004

(86) PCT No.: PCT/EP2004/014802
§ 371 (c)(1),
(2), (4) Date: Aug. 14, 2008

(87) PCT Pub. No.: WO2006/069589
PCT Pub. Date: Jul. 6, 2006

(65) Prior Publication Data
US 2008/0302858 A1 Dec. 11, 2008

(51) Int. Cl.
*B23K 31/00* (2006.01)
*B23K 37/04* (2006.01)
(52) U.S. Cl. .......... 228/175; 228/44.7; 228/124.5; 228/123.1; 228/120; 361/272
(58) Field of Classification Search .......... 228/175, 228/44.7, 124.5, 123.1, 120; 361/272
See application file for complete search history.

(56) References Cited

U.S. PATENT DOCUMENTS

| | | | |
|---|---|---|---|
| 2,385,386 A | | 9/1945 | Stoffel |
| 2,758,183 A | | 8/1956 | Canegallo |
| 4,250,534 A | * | 2/1981 | Brown et al. .......... 361/272 |
| 4,682,563 A | | 7/1987 | Masuda et al. |
| 5,918,362 A | * | 7/1999 | Yamashita et al. ........ 29/743 |
| 6,016,085 A | * | 1/2000 | Mazzochette ........ 333/22 R |
| 6,215,928 B1 | | 4/2001 | Friesem et al. |
| 6,250,341 B1 | * | 6/2001 | Helwig .......... 140/92.1 |
| 2003/0015572 A1 | * | 1/2003 | Faska et al. .......... 228/175 |

FOREIGN PATENT DOCUMENTS

EP  0 287 111 B1  10/1988
(Continued)

OTHER PUBLICATIONS

English Computer Translation of JP2000-061689.*
English Computer Translation of JP02-249201.*
English Computer Translation of JP10-241904.*

*Primary Examiner* — Jessica L Ward
*Assistant Examiner* — Erin Saad
(74) *Attorney, Agent, or Firm* — Don R Mollick

(57) ABSTRACT

To permanently apply lead terminals to corresponding electrodes of electronic or electro-optic components, the following steps are carried out: a. providing a frame including at least one tensioned wire, b. providing a holding jig including at least one seat in which a respective one of the components can be removably and temporarily retained, c. applying the components to the seats with the respective electrodes aligned along a respective longitudinal direction; in this way a row of aligned components is obtained, each component having a corresponding electrode aligned to the subsequent one in the row, d. applying the holding jig to the frame and orienting the same so that the longitudinal direction corresponds to the direction of the tensioned wire, the tensioned wire being thereby brought substantially in contact with (all) the electrode(s) aligned to each other on a corresponding row of components, e. electrically and mechanically bonding the tensioned wire to the corresponding electrodes; in this way all components are simultaneously bonded to the wire, and f. cutting the wire to separate the components from each other thereby forming a respective lead terminal for each electrode.

24 Claims, 12 Drawing Sheets

FOREIGN PATENT DOCUMENTS

| | | | |
|---|---|---|---|
| EP | 1 089 347 A2 | 4/2001 | |
| GB | 790325 | 2/1958 | |
| JP | 02249201 A | * 10/1990 | |
| JP | 10241904 A | * 9/1998 | |
| JP | 2000061689 A | * 2/2000 | |

* cited by examiner

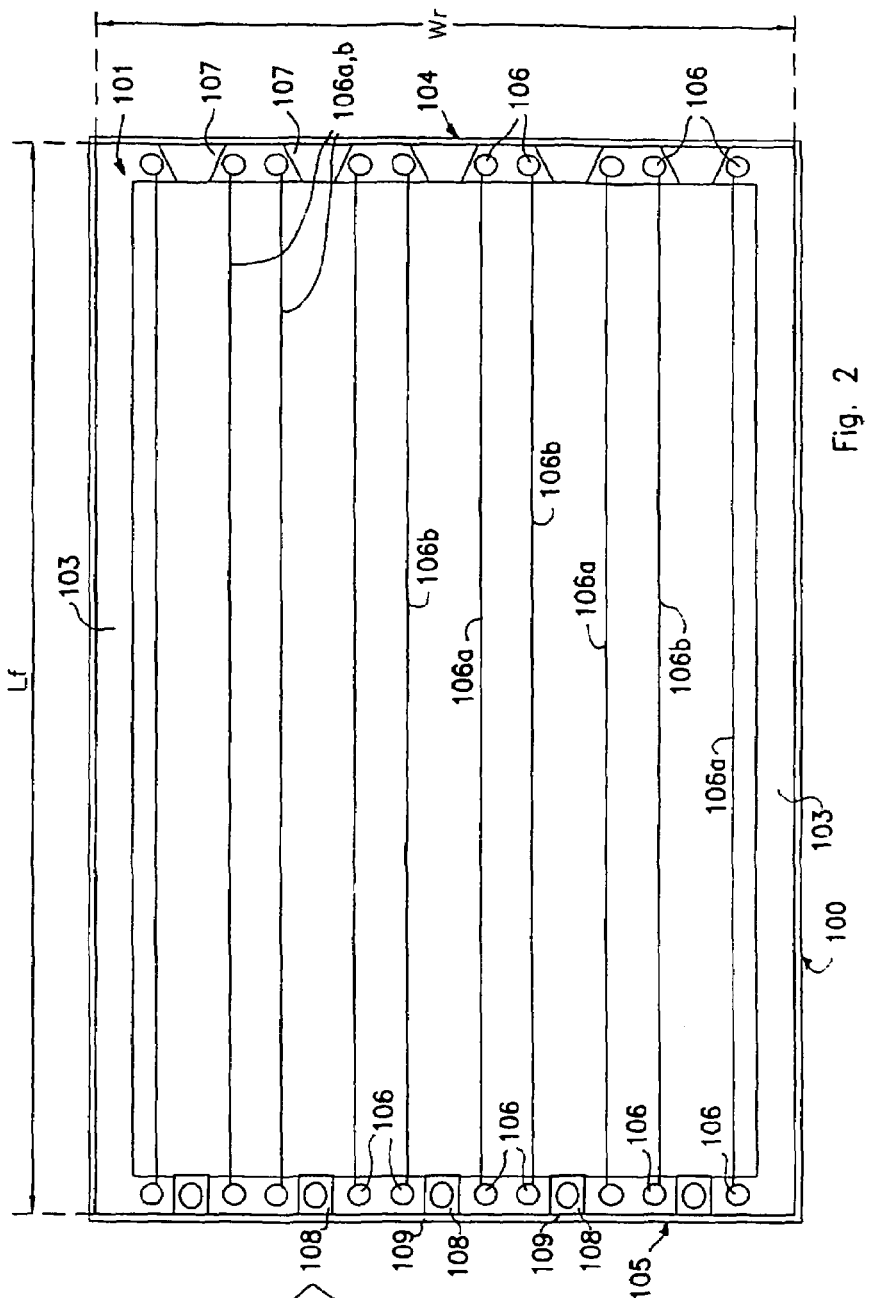
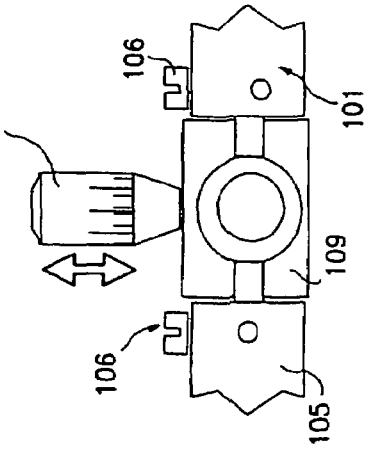
Fig. 2A
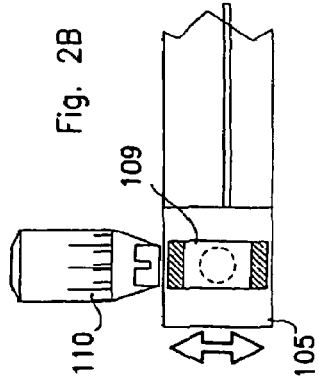
Fig. 2B
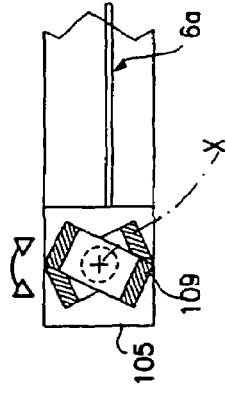
Fig. 2C

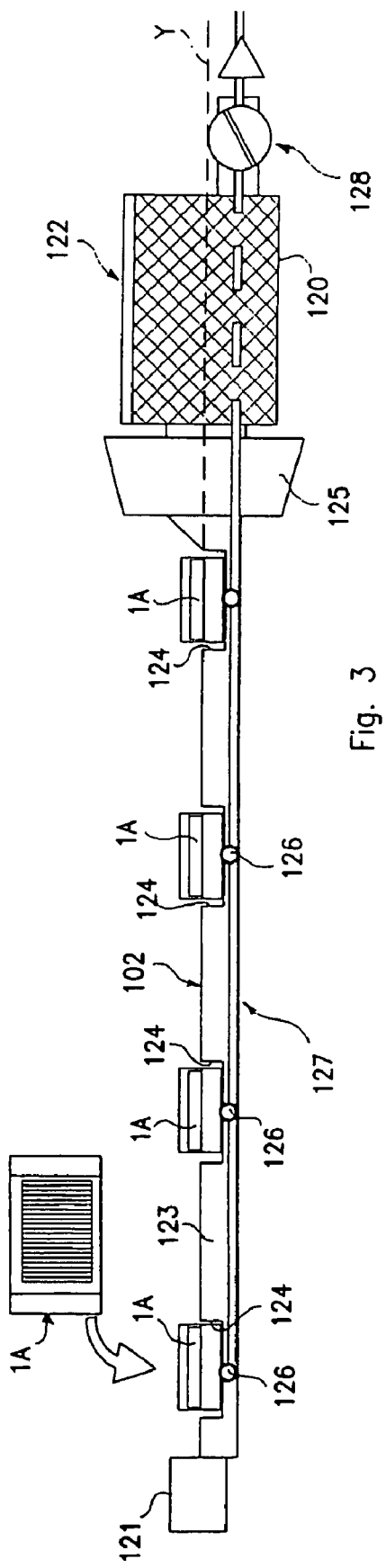
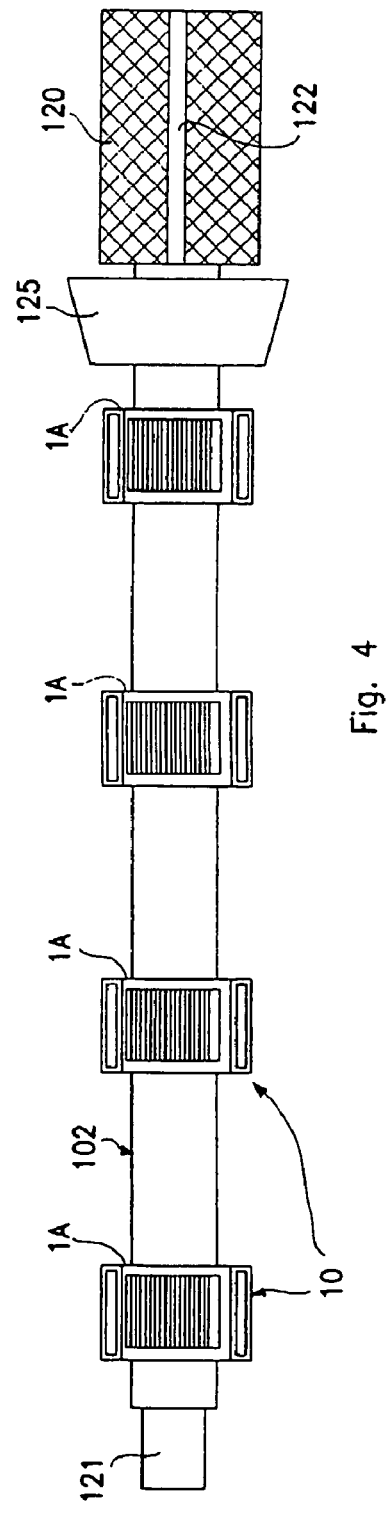
Fig. 3
Fig. 4

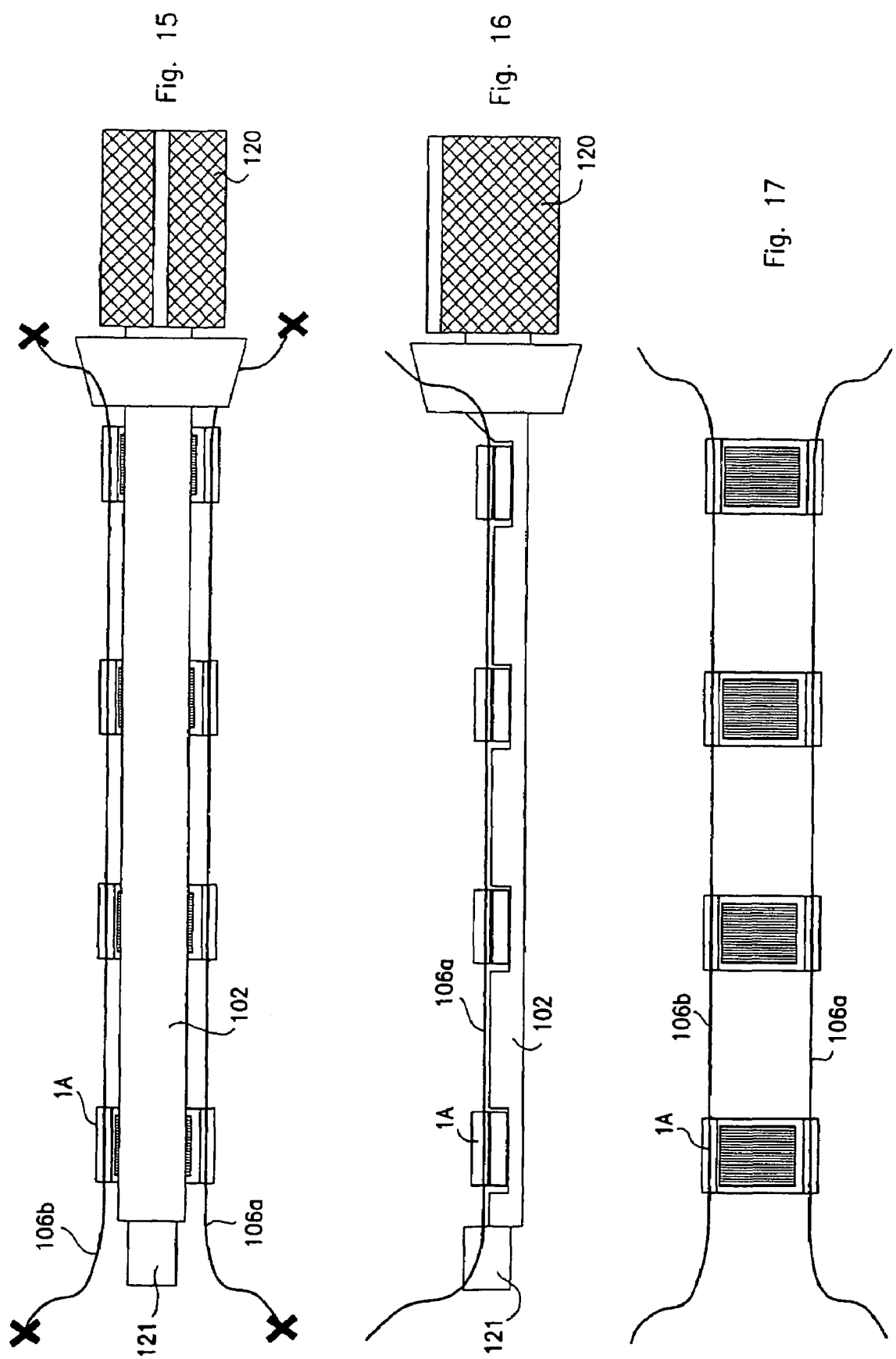

WIRING METHOD AND DEVICE

CROSS REFERENCE TO RELATED APPLICATION

This application is a national phase application based on PCT/EP2004/014802, filed Dec. 29, 2004, the content of which is incorporated herein by reference.

TECHNICAL FIELD

The present invention relates to a wiring method for permanently applying lead terminals to corresponding electrodes of electronic or electro-optic bipolar components. The invention also relates to a wiring device operating according to said method.

TECHNOLOGICAL BACKGROUND

Components adapted to be treated with the method and device of this invention include, by way of non limiting example, liquid crystal (LC) cells, including polymer dispersed liquid crystals, condensers, resistors, inductors, particularly of the surface mounting type, thin or thick film hybrid circuits and the like.

Traditionally, terminals suitable to be applied to such components are shaped as electro-conductive wires, strips or lead frames and are welded (brazed) or glued, using electro-conductive glues, onto respective contact electrodes. Also known are spring type lead frames such as those manufactured by Die-Tec, Inc., 295 Sipe Road—York Haven, Pa. 17370, which are mechanically locked to the electrodes.

The term "wire" in the following context will be used to define an elongated electrically conductive element having any suitable shape to form a lead terminal, including any elongated cylindrical or strip- or band-like shape suitable for this purpose, traditional wires, or lead frames.

Permanent application of "wires" in this technical field is also known as "wiring".

Presently known wiring techniques provides for the wiring of a single component at a time, by applying a layer of conductive glue or soldering paste over the electrodes, placing and holding appropriate wires in contact with the above mentioned layer and melting the soldering paste or curing the glue to obtain permanent mechanical and electric bonding of the wires to the electrodes. While these techniques allow high process automation and achievement of a reasonable wiring speed, the fact that each component is singularly wired as an individual element still remain an evident limitation to a very automated, high throughput wiring process.

U.S. Pat. No. 4,682,563 describes a jig for arraying and supporting a multiplicity of articles to be soldered, such as ICs. This patent is mentioned as background art but it is not pertinent to the invention.

The technical problem at the basis of this invention is that of providing a new wiring method for electronic or electro-optic bipolar components by which either one or a plurality of components can be simultaneously wired. Within the general sphere of this problem, it is an important scope of the invention to provide a method applicable to different types of components without substantial changes.

DISCLOSURE OF THE INVENTION

Briefly, the method of the present invention, to permanently apply lead terminals to corresponding electrodes of electronic or electro-optic components, comprises the following steps:

a) providing a frame including at least one tensioned wire,
b) providing a holding jig including at least one seat in which a respective one of said components can be removably and temporarily retained,
c) applying said components to said seats with the respective electrodes aligned along a respective longitudinal direction; in this way a row of aligned components is obtained, each component having a corresponding electrode aligned to the subsequent one in the row,
d) applying said holding jig to said frame and orienting the same so that said longitudinal direction corresponds to the direction of said tensioned wire, said tensioned wire being thereby brought substantially in contact with (all) the electrode(s) aligned to each other on a corresponding row of components,
e) electrically and mechanically bonding said tensioned wire to the corresponding electrodes; in this way all components are simultaneously bonded to the wire,
f) cut said wire to separate said components from each other thereby forming a respective lead terminal for each electrode.

Although the method of the invention is directed to wiring of bipolar components it may happen that only one of the electrodes is wired. Typically, this is the case of radiative RF (Radio Frequency) or MW (microwave) devices such as transmitting and/or receiving antennas or electronic or electro-optic devices in which the electrode that needs no wiring is represented by an extended metallization on one of the two main surfaces of the device. Examples thereof are ground-plane electrodes, sliding contact surfaces, or transducer parts of sensors (i.e. plates for electric charge sensors).

By this method it is possible to mechanically and electrically bond all components applied to a holding jig simultaneously to the tensioned wire or wires so that all components applied to the same jig are connected with a corresponding electrode to the same wire which is then cut to separate the components from each other but leaving a barb of wire attached to the corresponding electrode as a lead terminal thereof.

The components preferably include one or more layers superimposed to one another, having at least two electrodes which are set at a distance from each other and are substantially parallel to one another. This is the typical case of bipolar components.

In that case, a corresponding number (at least two) of tensioned wires are provided on the frame, the wires being set at the same distance from each other as the electrodes, so that, when one of said wires is substantially in contact with one of said electrodes, the other one of said wires is also substantially in contact with the other one of said electrodes.

The wording "substantially in contact" is intended to mean, in this context, that the wires are spaced apart from the surface of the electrodes, when applied thereto prior to bonding, of a distance comprised between 0 and 200 micrometers.

BRIEF DESCRIPTION OF THE DRAWINGS

Further features and advantages of the invention will appear from the following detailed description thereof given by way of example, with reference to the attached drawings wherein:

FIG. 2 is a top plan view of a first component of the device of this invention;

FIGS. 2A, 2B and 2C show particulars on an enlarged scale of the first component of FIG. 2;

FIGS. 3 and 4 are respectively a side view and a top plan view of a second component of the device of this invention;

FIGS. 15 to 19 are plan views showing the subsequent phases of the method of this invention.

PREFERRED EMBODIMENTS OF THE INVENTION

Figure 1A:
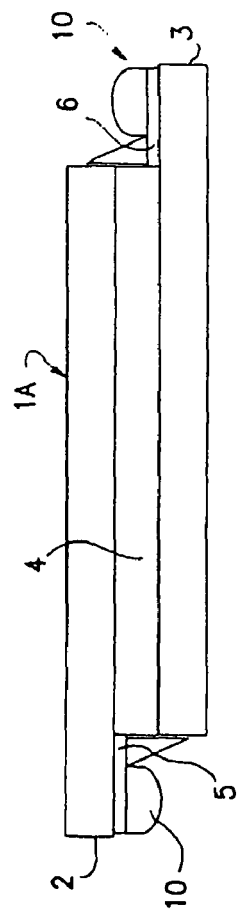
FIGS. 1A, B and C are schematic side views of three different types of components adapted to be wired with the method and device of this invention.
Figure 1B:
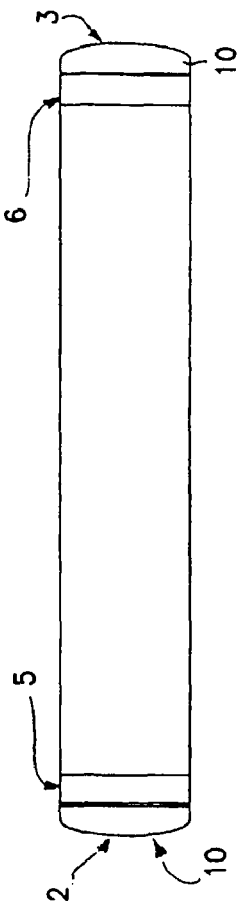
Figure 1C:
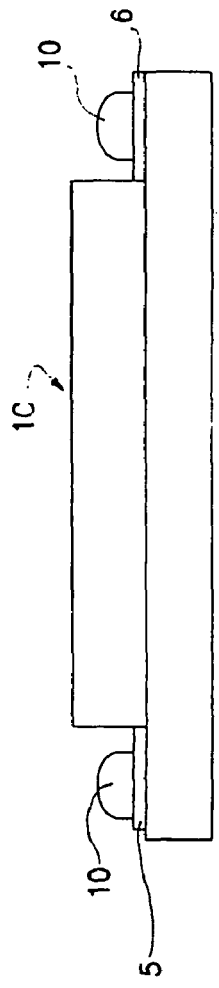

FIGS. 1A through 1C disclose typical configuration of electronic or electro-optic bipolar components suitable for the wiring method and device of this invention. Identical reference numerals indicate functionally identical parts.

FIG. 1A shows schematically a cell 1A of the liquid crystal (LC) or polymer disperse liquid crystal (PDLC) type, including two transparent electrode-bearing sides 2,3 and a spacer 4 comprised there between including a LC or a PDLC. For instance, sides 2 and 3 can each comprise a transparent electric conductor, which is capped by a supporting glass layer. Respective electrode pads 5,6 are formed on each of the sides 2,3.

An example of a cell 1A is the assembly of a tuneable mirror such as the one disclosed in U.S. Pat. No. 6,215,928.

The geometry of the cell 1B of FIG. 1B is frequently used in passive electronic components (resistors, condensers and inductors) of the surface mounting type or hybrid circuits (thick or thin film). Electrode pads 5,6 are placed on two opposite longitudinal sides of the cell.

FIG. 1C discloses another possible geometry of a cell 1C provided with coplanar electrode pads 5,6.

Figure 13:
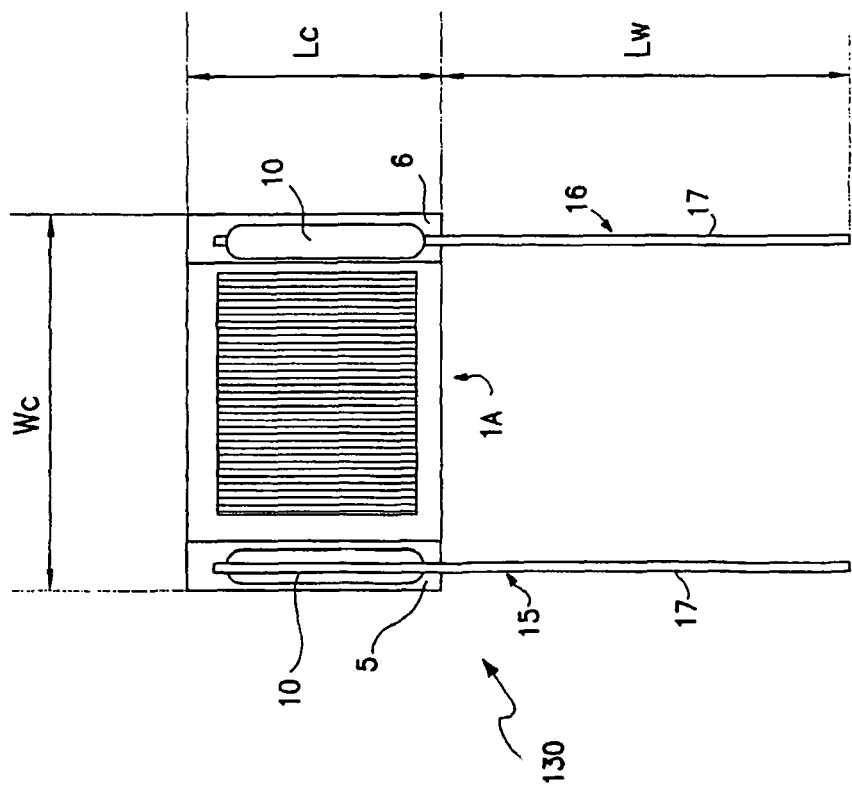
FIG. 13 is a top plan view of a wired component.

A wired cell of the 1A type is shown at FIG. 13, wherein two lead terminals 15, 16 affixed to the respective electrode surface 5,6 have lead or extensions 17. Similar structure apply to the cells of the 1B and 1C type, when wired.

Figure 14:
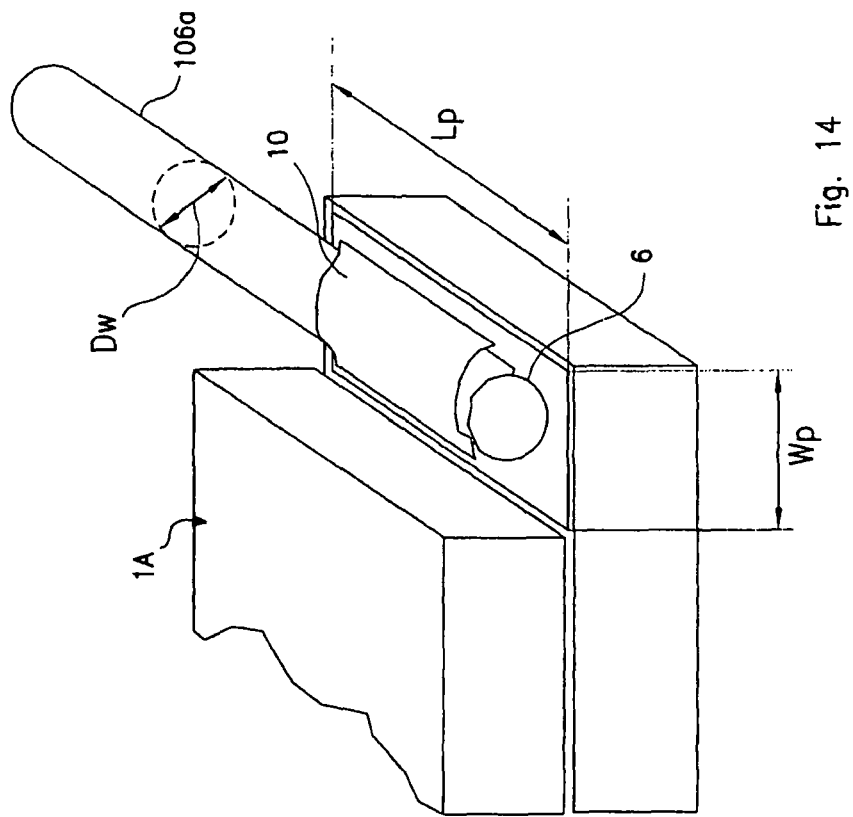
FIG. 14 is a perspective partial view of the component of FIG. 13 on an enlarged scale.

Wc and Lc respectively indicate the width and length of the cell 1A as shown in FIG. 13. Lw indicates the effective terminal wire length, while dw is its diameter, assuming that the terminal has a circular cross section (FIG. 14). Wp and Lp indicate the electrode pad width and length, respectively. Finally, reference numeral 10 indicates a layer of soldering material, i.e., soldering paste or glue, provided onto the electrode pads 5,6 to electrically and mechanically bond thereto the lead terminals 15, 16. Although generally a layer of soldering material is applied to the electrode pads, a drop or a ball of soldering material can be envisaged in the method of the invention.

A wiring device 100 for applying the lead terminals 15,16 to the cells 1A,B,C (herein below jointly referred to as "components") according to the present invention includes a frame 101 (FIG. 2) and a plurality of holding jigs 102 (FIGS. 3 and 4).

The frame 101 (FIG. 2) has a rectangular shape with two opposite longitudinal legs both indicated by 103, determining a frame length Lf, and two opposite transverse legs 104 and 105, determining a frame width Wf. A plurality of wire pairs 106a,b are tensioned between the transverse legs 104, 105 with respective wire ends retained by clamping screws 106. The term "tensioned wire" in the following context is intended to mean a tensioned electro-conductive element having any shape suitable to form a lead terminal, including any elongate or strip- or band-like shape suitable for this purpose.

Figure 2D:
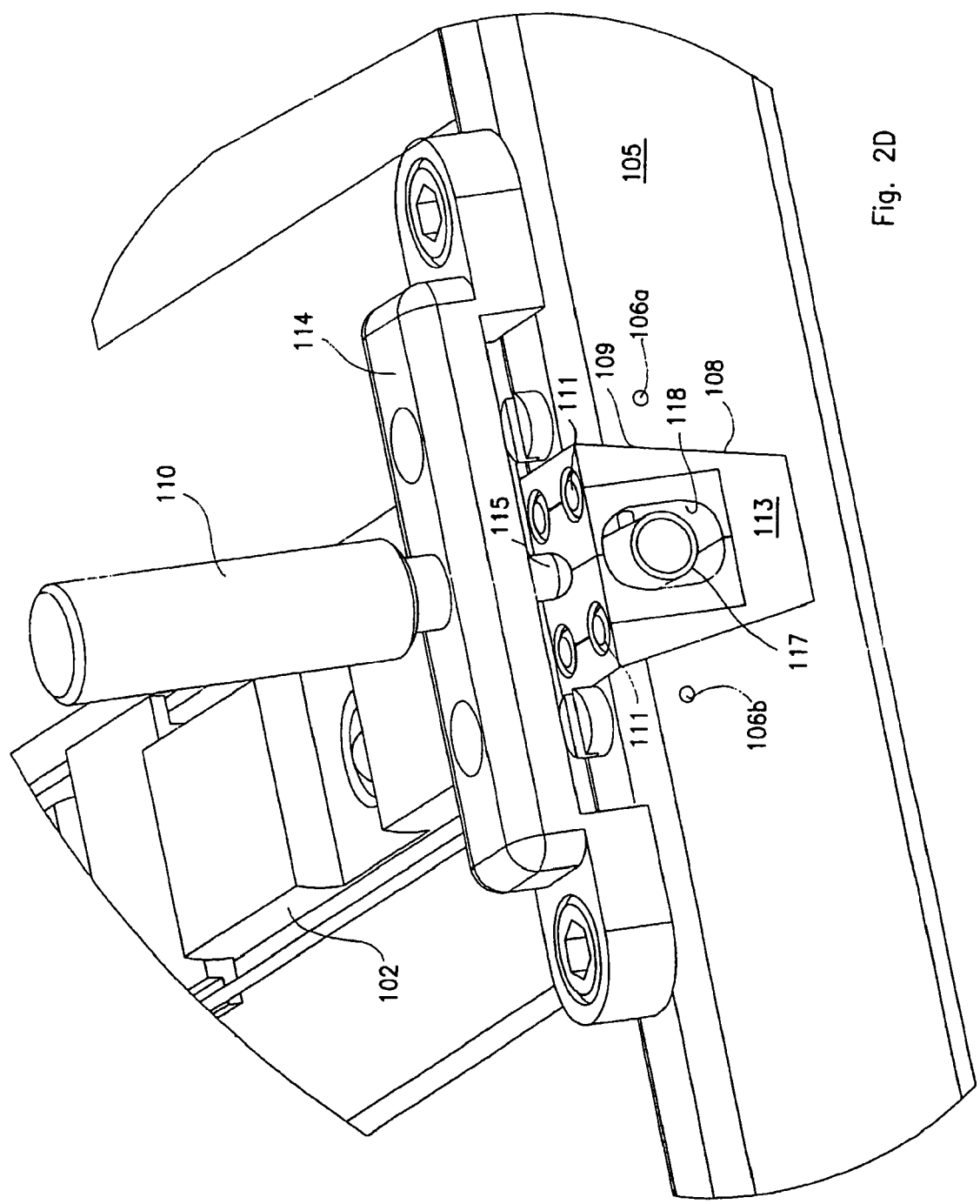
FIGS. 2D and 2E are enlarged perspective views in an assembled and exploded state respectively of the component of FIGS. 2A to 2C.
Figure 2E:
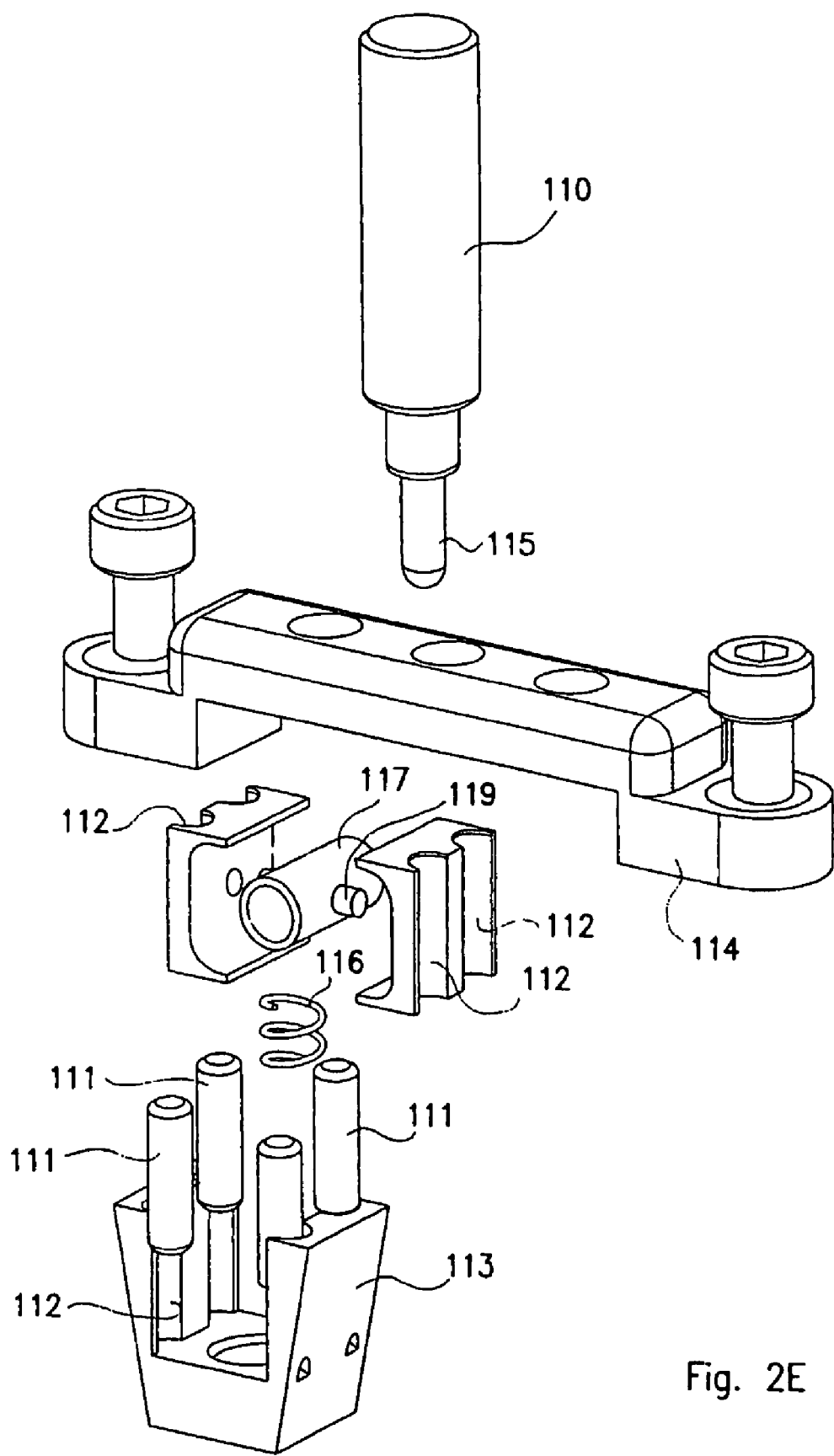

A first seat 107 is provided in leg 104 between each pair of wires 106a,b while a second seat 108 is provided in a corresponding position in leg 105. Seats 107, 108 are aligned to each other and parallel to the wires 106a,b. The seat 108 includes a sleeve 109 which is slidably guided on the leg 105 in a direction perpendicular to the leg and wires. The position of sleeve 109 is adjustable by means of a vernier group 110. Details of the seat 108, sleeve 109 and vernier group 110 are shown in FIGS. 2D and 2E in an assembled and exploded perspective view, respectively. The sleeve 109 is made by two parts both guided on guide pins 111 perpendicularly to the frame leg 105. The pins 111 are slidably nested in respective guiding grooves 112 one half of which is obtained in the sleeve outer surface and the other half in a corresponding housing provided in a centering block 113 which is fitted in the seat 108 of the frame leg. The vernier group 110 is mounted on a bridge member 114 with an adjusting pin 115 thereof urging the sleeve 109 against the bias of a spring 116. A pivoting element 117 is mounted within an aperture 118 in sleeve 109 held by pins 119 on a pivot axis.

The holding jig 102 (FIGS. 3 and 4) includes a knob 120 at one longitudinal end and a nose 121 at the opposite end, the nose 121 being rotatably is received in the pivoting element 117 of sleeve 109 when the jig is mounted to the frame. The jig can be rotated on a longitudinal axis Y acting on the knob 120, a marker 122 being provided on the knob to indicate the position of the jig relatively to the frame during rotation thereof.

The jig includes a shaft 123 having a plurality of seats 124 in the form of transverse notches. The seats 124 are intended to receive each a corresponding component or cell 1A, B, or C, all components being of the same type, shape and dimensions.

An insert 125 is provided on the shaft 123 at the knob side, the insert 125 being shaped so as to self-centering fit into the first seat 107 of the frame. Each seat 124 has a bottom provided with a releasably retaining element such as a suction duct 126 connected to a suction channel 127 extending through the jig and terminating at a suction valve 128 by means of which said channel can be connected to a vacuum source such as a vacuum pump. Means other than suction can be however used to retain the components 1A, B, or C in the seats 124, such as an adhesive layer covering the bottom of seats 124 or mechanical retaining means such as clips and the like.

According to the method of this invention, the frame is first "wired" by fixing thereto a plurality of tensioned wires by means of clamping screws 106; meanwhile a soldering material is applied to the electrode pads of each cell to be wired.

It has been noted that the volume of the soldering material will depend on the dimension of the surface of the electrode pads as well as from the volume of the section of wire extending over the pad surface: preferably the soldering material shall be applied so as to cover not less than 60% of the surface of each electrode pad and the volume thereof shall be 1 to 4 times the volume of the section of wire extending over the pad surface. Higher volumes of glue used as soldering material may cause percolation and/or contamination of other surfaces.

Appropriate glues are conductive epoxies. Examples thereof are TRA-DUCT 2902 or TRA-DUCT 916H03 by TRACON Inc. (45 Wiggins Avenue, Bedford, Mass. 01730-USA) or AGAR Acheson Silver DAG 1415M or similar. These glues are then baked with baking parameters spanning from 24 hours at 25° C. to 1-30 minutes at 180° C. as will be made clear hereafter with reference to the baking phase.

In case of soldering techniques, it is a first requirement that the electrode pad surface be metallurgically compatible with the wire. Examples are pads made of Cu, Ti also coated with a plurality of coatings such as Pd, Ni, Au, with wires of Cu, Fe—Ni alloys or Zn, with appropriate soldering materials such as Sn, Pb In and Ag, alloys.

An eutectic alloy known as INDIUM ALLOY #290 In 97% Ag3% melting at 143° C. has been used successfully.

Due to the thermal sensitivity of liquid crystals, technological processes that include baking at relatively high temperatures are generally avoided. The maximum temperature that a LC cell can bear without being damaged depends of course on the type of LC (or PDLC) and on the baking time.

The soldering parameters shall be preferably chosen as follows.

A preferred baking temperature range is 118 to 280° C., depending on the is volume Vc and thermal mass of the cell. The higher is the thermal mass of the cell the lower shall be the baking temperature. It has been noted that for volumes Vc of 50 mm³ or lower, a baking temperature of 280° C. for a baking time of 5 seconds is preferable; for Vc comprised between 50 and 250 mm³ baking temperature and time shall be adjusted to 180° C. and 5 minutes respectively; for Vc comprised between 250 and 1000 mm³ baking temperature and time shall be adjusted to up to 150° C. and 60 minutes, preferably.

Particular in case of LC cells, baking time is selected depending also on the baking temperature. For instance, at baking temperature of 280° C., the baking time should preferably not be higher than a few seconds, e.g., 5 s.

With INDIUM ALLOY #290 In 97% Ag3% melting at 143° C. as soldering material, wires size of 100 micrometers in diameter and cells having a volume of 70 mm³ no derating of the cell occurred even with long baking times (ex. 120 minutes).

As far as the frame, wires and cell parameters defined above are concerned, it has been found that the following relationships preferably apply.

$0.1\ Wc \leq Lc \leq 10\ Wc$
$Lc \leq Lw \leq 20\ Lc$
$0.1\ Wp \leq D \leq 0.8\ Wp$
$Wp \leq Lp \leq 10\ Wp$ The frame shall be organised to accept a number of jigs between 1 and 100 and a corresponding number of wire pairs.

The distance (or pitch) between the wires $106a,b$ of each pair shall be substantially identical to the distance between the electrode pads 5, 6 of the cell. With particular reference to the component of FIG. 1A, the thickness of the cell spacer 4 shall determine the offset, if any, between the wires $106a,b$ of each pair.

The frame length Lf is critical for a proper tension of the tensioned wires. A satisfactory ratio between Lf and the wire diameter dw respecting the elongation characteristics of most common electro-conductive wiring materials (including Au and Ag) is given by the following empiric formula:

$Lf/dw=1000$ for $50\ \mu m < dw < 350\ \mu m$
$Lf/dw=1500$ for $350\ \mu m < dw < 800\ \mu m$
$Lf/dw=1850$ for $800\ \mu m < dw < 1000\ \mu m$ Typical dimension of frames may vary from 0.001 m² to 2 m² and above with a number of cells per frame from 1 to 1000.

An important feature of this technology is that the frames may be superimposed to one another thereby obtaining a multi-layer structure which allows space saving.

Dimensional stability of the frame is also important, particularly as far as the camber of the legs under the tension of the wires is concerned. A camber of each leg of less than 1/800 on the length of the leg itself was found satisfactory, the camber being measured at the maximum temperature at which the frame can be exposed during baking of the glues or soldering paste.

Frames having an area of 0.04 m² and up to 2 m² or above are preferably made of metals, (also as a section bar) such as aluminium and its alloys, Fe—Ni alloys (es. Kovar, Invar, etc.), brass, steel, etc.

For lower area frames an economically more affordable solution could be represented by extruded or moulded plastics chosen from technical polymers having high dimensional stability such as ABS, glass-filled nylon, polycarbonates, and similar.

Once provided both frame 101 and jigs 102 and wired the frame, the jigs 102 are loaded with cells by positioning each cell in the respective seat 124 so that the electrode pads 5,6 are aligned to each other along two longitudinal directions parallel to the jig axis Y.

Either prior to loading cells into the jigs or immediately thereafter but anyway prior to inserting the jigs into the frame, the glue or soldering paste is applied to the electrodes.

The jigs are then inserted into the frame.

Figure 5:
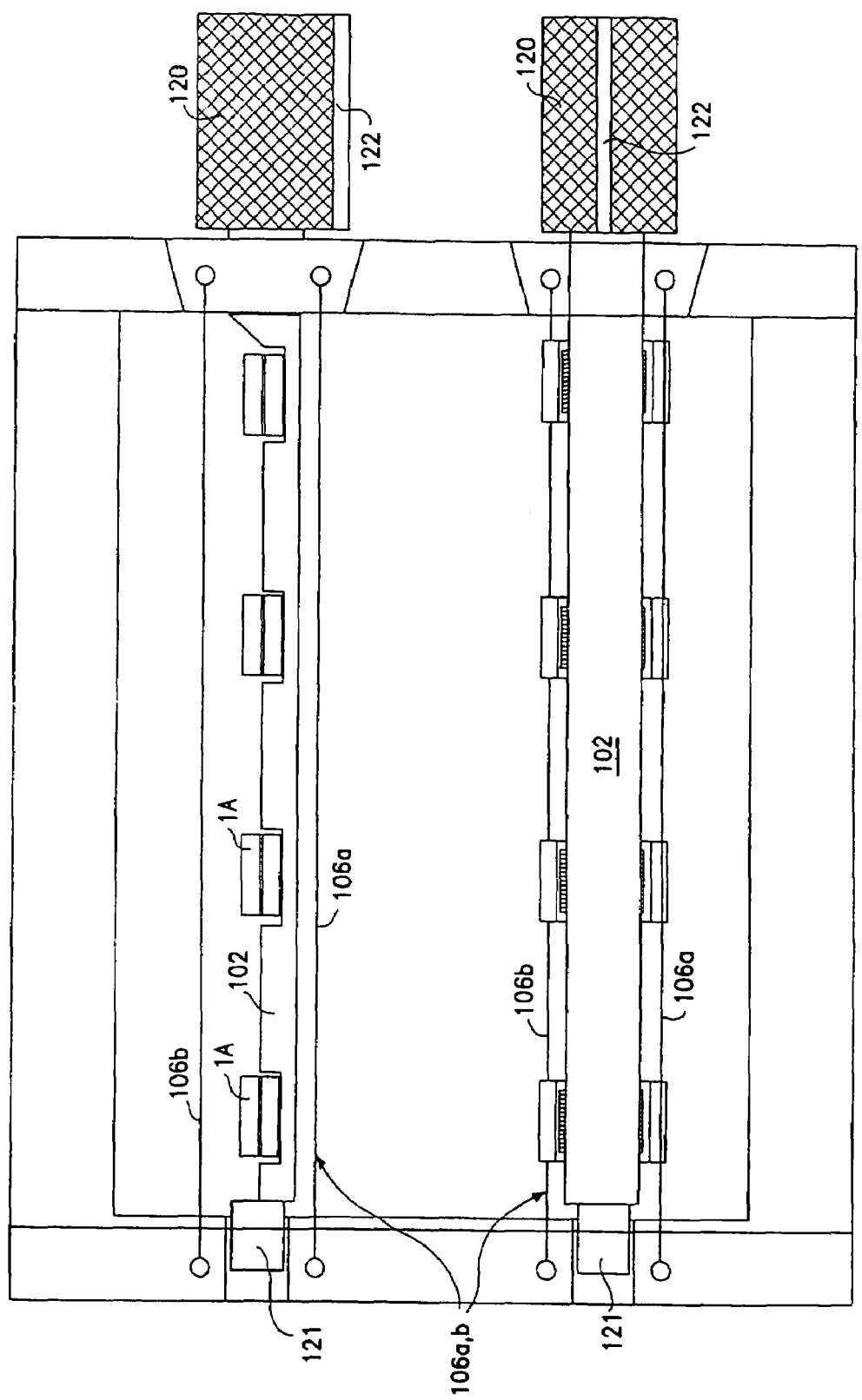
FIGS. 5 to 7 are respectively a top plan view ad two cross sectional views of the device of the preceding figures in two different phases of the method of the invention applied to the component of FIG. 1A.
Figure 7:
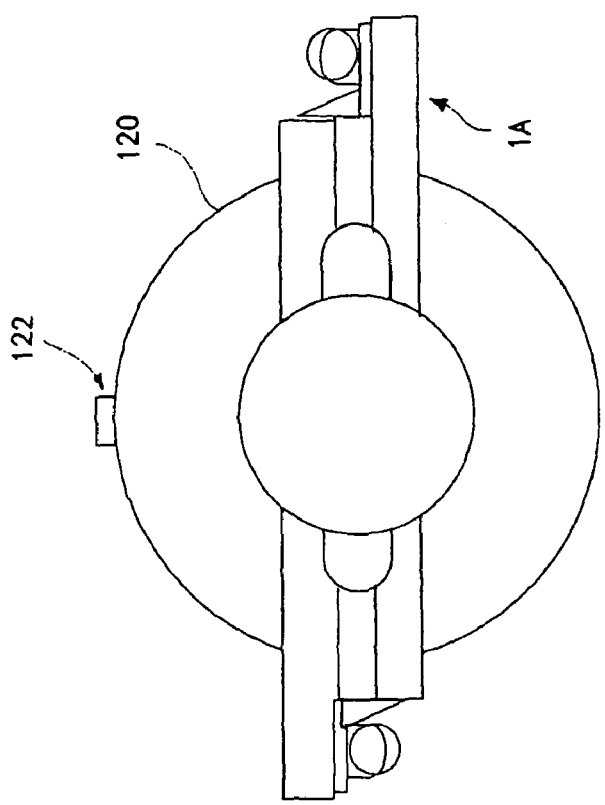
Figure 6:
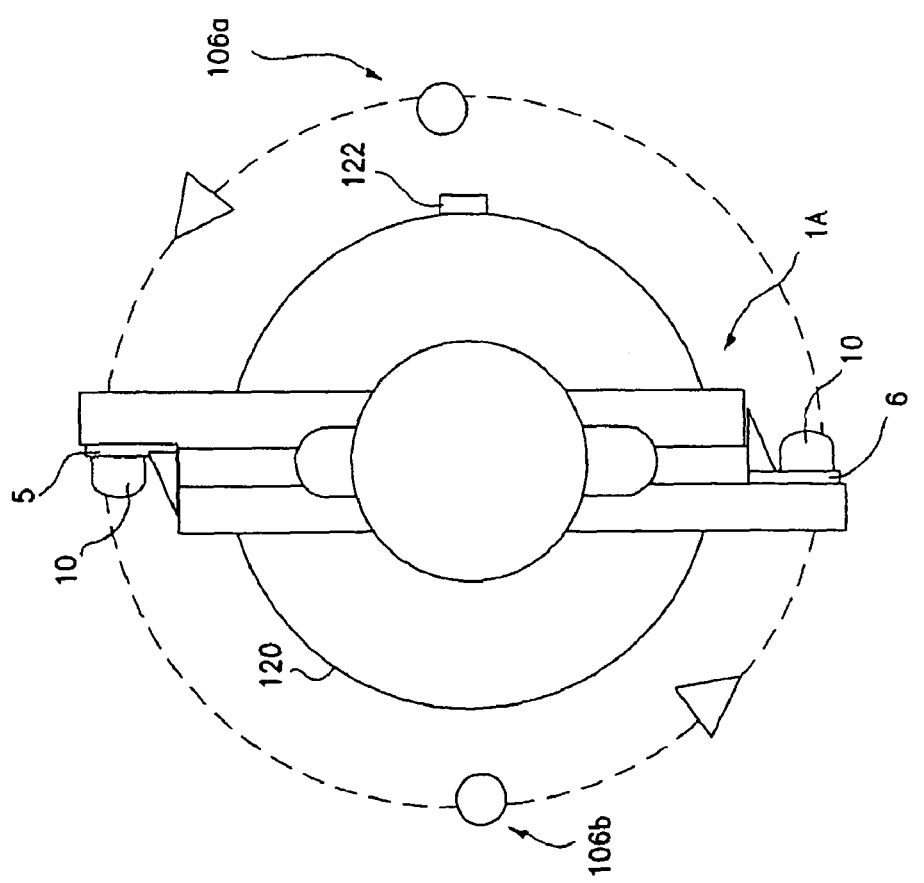
Figure 9:
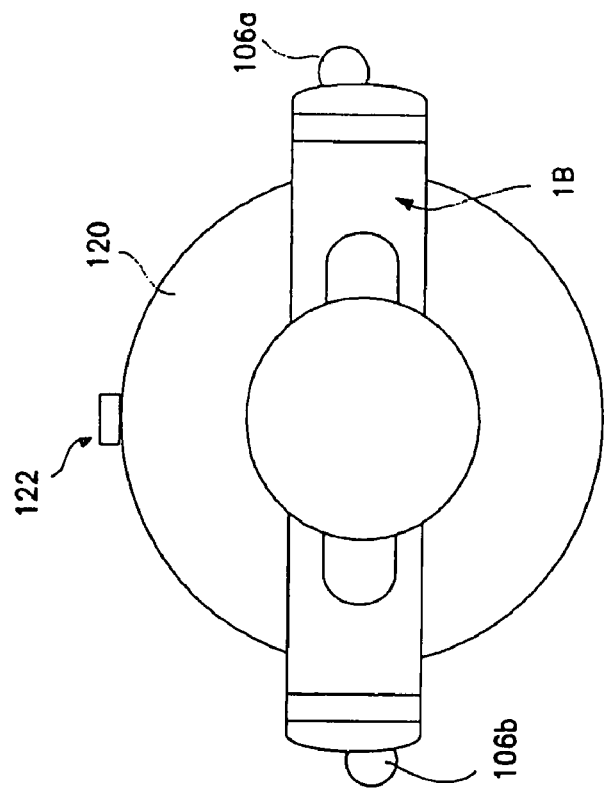
FIGS. 8 and 9 are cross sectional views identical to FIGS. 6 and 7 showing the method of the invention applied to the component of FIG. 1B.
Figure 8:
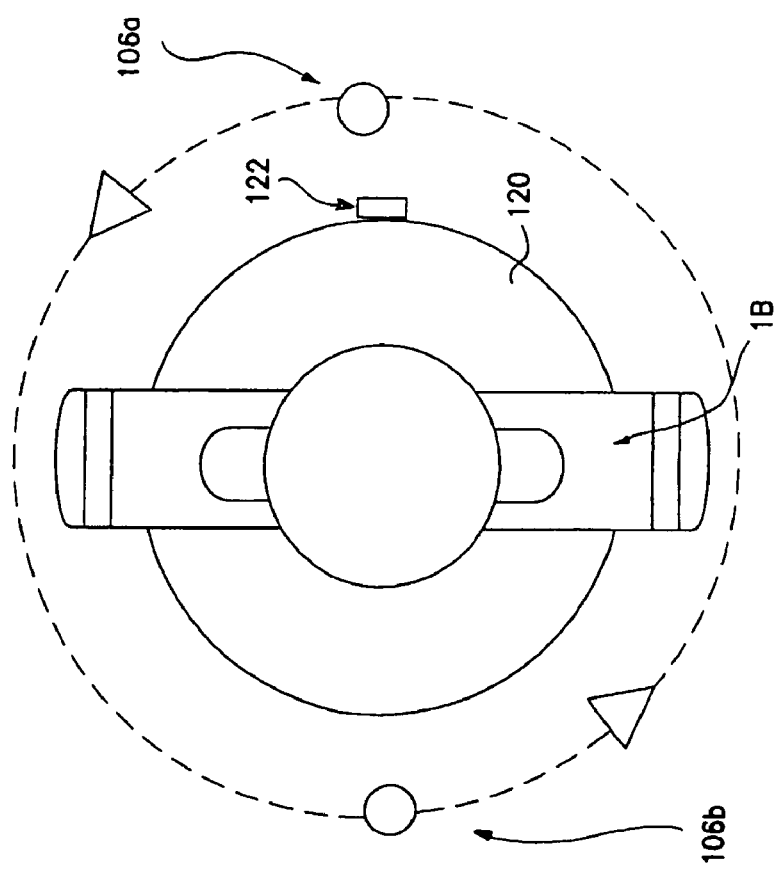
Figure 11:
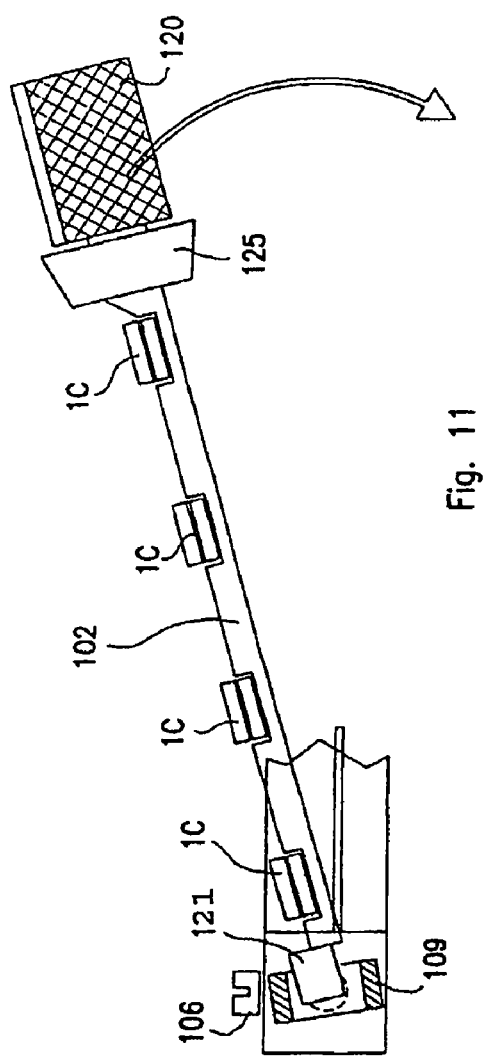
FIGS. 11 and 12 are side views of the device of FIG. 5 when used with the component of FIG. 1C.
Figure 12:
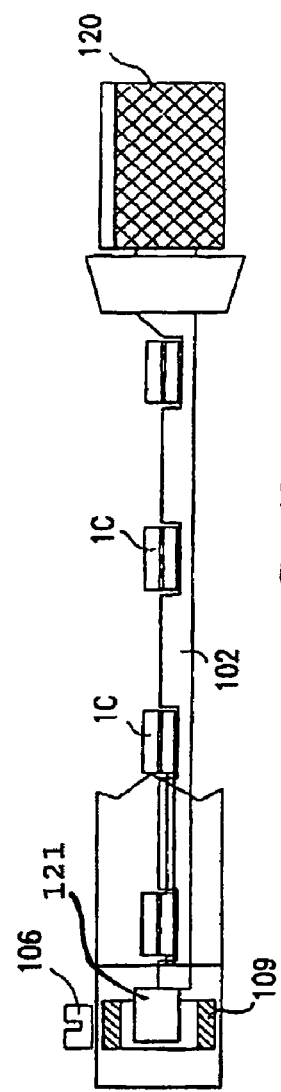
Figure 10:
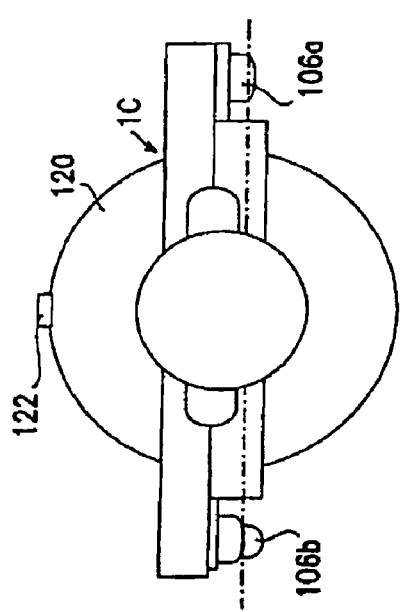
FIG. 10 is a cross sectional view identical to FIG. 7 showing the method of the invention applied to the component of FIG. 1C.

For jigs bearing cells of the 1A or 1B type the jig is first inserted in the frame standing on edge, as shown in the upper part of FIG. 5 or FIG. 6 (cells 1A) or in FIG. 8 (cells 1B) and than rotated by 90° or less, depending on the thickness of the cell, until the electrode pads are brought substantially in contact with the wires $106a,b$. (lower part of FIG. 5 and FIG. 7 for cells of the 1A type and FIG. 9 for cells of the 1B type)) Substantially in contact is intended to mean that the wires be spaced apart from the respective pads of a distance comprised between 0 and 200 μm. For cells of the 1C type, the jig is inserted into the frame as shown in FIGS. 11 and 12, first nesting the nose 121 into the sleeve 109 and then pivoting the jig and sleeve so as to lower the knob 120 toward the frame 101. In this way the wires 106A,B are brought into substantial contact with the electrodes 5,6, the contacting conditions being adjustable by means of the vernier 110.

The system is then placed in a heated environment to cure the glue or melt the soldering paste as taught above. This step is generally indicated as "baking".

Mechanical and electrical bonding of the wires to the electrode pads is thereby obtained.

Then the pair of wires are cut close to the respective frame legs (FIG. 15), the jigs are removed from the frame (FIG. 16) and the set of cells attached to each other in parallel, in a sort of chain, are removed from the jigs by closing the suction valve 128. This step is shown in FIG. 17.

Figure 18:
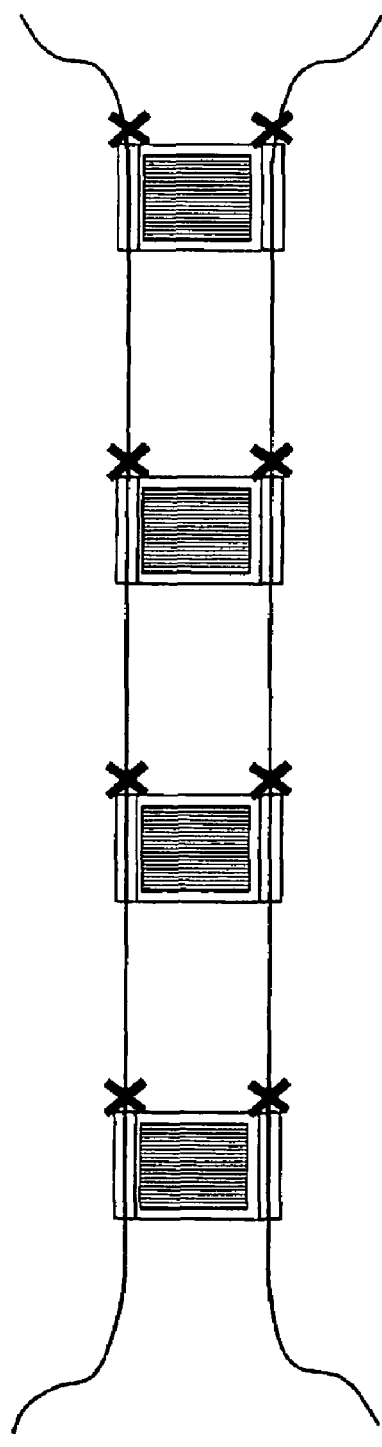

To singularise the wired components, the wires $106a,b$ are cut close to the same side of each cell, as indicated by a cross in FIG. 18, according to the wiring design needed.

Figure 19:
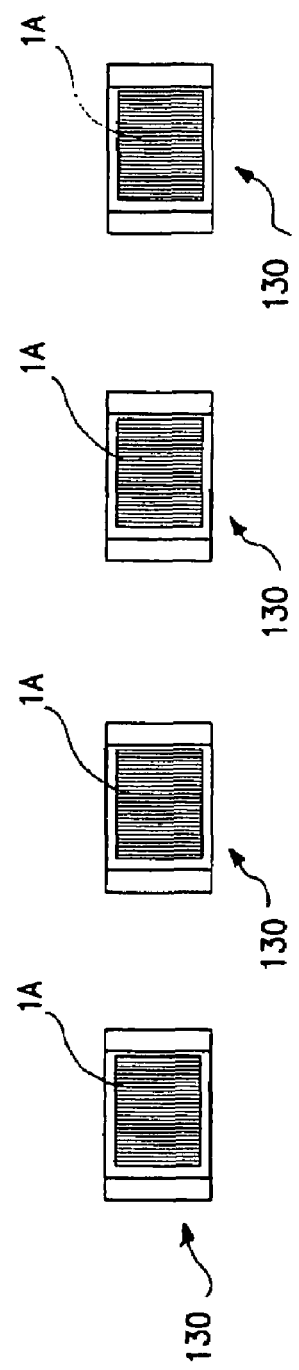

The singularised components 1A,B or C provided with wirings, comprehensively indicated by 130 in FIGS. 13 and 19 are then ready for test and packaging.

The invention claimed is:

1. A method to permanently apply lead terminals to corresponding electrodes of electronic or electro-optic components comprising the steps of:
   a. providing a frame comprising at least one tensioned wire;
   b. providing a holding jig comprising at least one seat in which a respective one of said components can be removably and temporarily retained;
   c. receiving said components in said at least one seat with the respective electrodes aligned along a respective longitudinal direction, such that said components are retained in said jig;
   d. receiving said holding jig retaining said components in said frame and orienting the same so that said longitudinal direction corresponds to said tensioned wire and said at least one tensioned wire is substantially in contact with said electrodes;
   e. electrically and mechanically bonding said tensioned wire to the corresponding electrodes; and
   f. removing said components from said at least one seat and cutting said tensioned wire to separate said wired components from each other thereby forming a respective lead terminal for each electrode.

2. The wiring method according to claim 1, wherein said components have each at least two electrodes which are set at a distance from each other and wherein at least two tensioned wires set at the same distance from each other are tensioned in said frame.

3. The wiring method according to claim 2, wherein the at least two electrodes are two electrodes and the at least two tensioned wires are two tensioned wires, and wherein said holding jig and said tensioned wires are reciprocally disposed so that, when one of said tensioned wires is substantially in contact with one of said electrodes, the other one of said tensioned wires is also substantially in contact with the other one of said electrodes.

4. The wiring method according to claim 1, wherein a plurality of seats is formed on said holding jig to receive a corresponding plurality of components aligned in a row extending parallel to said longitudinal direction.

5. The wiring method according to claim 4, wherein said components are removably held in position within the respective seats in said holding jig by means of air suction applied between said seats and the component received therein.

6. The wiring method according to claim 1, wherein the step of bonding comprises applying a soldering material to said electrodes and bringing said tensioned wires in contact with said soldering material.

7. The wiring method according to claim 6, wherein bringing said tensioned wires in contact with said soldering material is followed by baking said soldering material at a baking temperature to permanently attach said tensioned wires to said electrodes.

8. The wiring method according to claim 6, wherein said tensioned wires are brought in contact with said soldering material at a distance from the respective electrodes of 0 to 100 microns.

9. The wiring method of claim 7, wherein said soldering material is a soldering paste and baking comprises melting of the soldering material.

10. The wiring method according to claim 9, wherein the soldering material for the bonding of the tensioned wires is a Sn, Pb, Ag, or In based alloy.

11. The wiring method according to claim 10, wherein said soldering paste is a eutectic indium alloy comprising In 97% Ag3%.

12. The wiring method according to claim 1, wherein said electrodes are made of a Cu, Ti pad.

13. The wiring method according to claim 1, wherein said tensioned wires comprise Cu, Fe—Ni, or Zn and corresponding alloys.

14. The wiring method according to claim 12, wherein said electrodes are coated with coatings chosen from Pd, Ni, and Au.

15. The wiring method according to claim 7, wherein said baking temperature is 118° to 280° C.

16. The wiring method according to claim 15, wherein said baking temperature is maintained for a baking time of less than 2 hours when said baking temperature is between 143° C. and 280° C.

17. The wiring method according to claim 16, wherein said baking time is progressively decreased from 2 hours to 5 seconds when said baking temperature is increased from 143° to 280° C.

18. The wiring method according to claim 15, wherein the baking temperature is inversely proportional to the volume of the component.

19. The wiring method according to claim 18, wherein for a component volume of less than 50 mm$^3$, the baking temperature and time are respectively up to 280° C. and 5 seconds, for a component volume of 50 to 250 mm$^3$, the baking temperature and time are respectively up to 180° C. and 5 minutes, while for a component volume of 250 to 1000 mm$^3$ the baking temperature and time are respectively up to 150° C. and 60 minutes.

20. The wiring method according to claim 6, wherein the soldering material is disposed over the corresponding electrodes to cover not less than 60% of the electrode surface.

21. The wiring method according to claim 7, wherein the volume of the soldering material is 1 to 4 times the volume of the section of tensioned wire laying over the surface of the electrode to be connected thereto.

22. The wiring method according to claim 7, wherein a baking temperature of 25° to 180° C. and a baking time of 1 minute to 24 hours are applied during the baking phase of said soldering material.

23. The wiring method according to claim 1 wherein said jig is inserted in the frame standing on edge and then rotated relative to the frame until the electrodes are brought substantially in contact with the tensioned wires.

24. The wiring method according to claim 1, wherein said jig is inserted into the frame by nesting a nose at one axial end thereof into a sleeve pivotally mounted on the frame and then pivoting the jig and sleeve so as to lower an opposite axial end of said jig toward the frame, thereby bringing the electrodes into substantial contact with the said tensioned wires.

* * * * *